United States Patent
Francis

(10) Patent No.: US 8,945,407 B2
(45) Date of Patent: Feb. 3, 2015

(54) TOUCHLESS SITE ISOLATION USING GAS BEARING

(75) Inventor: Aaron Francis, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 361 days.

(21) Appl. No.: 13/337,374

(22) Filed: Dec. 27, 2011

(65) Prior Publication Data

US 2013/0160858 A1  Jun. 27, 2013

(51) Int. Cl.
*H01L 21/302* (2006.01)
*B08B 3/04* (2006.01)

(52) U.S. Cl.
USPC .......... 216/41; 134/36; 134/37; 216/45; 216/83

(58) Field of Classification Search
None
See application file for complete search history.

(56) References Cited

U.S. PATENT DOCUMENTS

| | | | | |
|---|---|---|---|---|
| 6,764,386 B2 * | 7/2004 | Uziel | ............... | 451/39 |
| 6,869,890 B2 * | 3/2005 | Noji et al. | ............... | 438/758 |
| 7,098,045 B2 * | 8/2006 | Noji et al. | ............... | 438/5 |
| 8,617,409 B2 * | 12/2013 | Kelekar et al. | ............... | 216/41 |
| 2008/0225248 A1 | 9/2008 | Poon et al. | | |
| 2010/0282271 A1 * | 11/2010 | Devitt | ............... | 134/1 |
| 2012/0164841 A1 | 6/2012 | Kelekar | | |
| 2013/0025688 A1 | 1/2013 | Egami et al. | | |
| 2013/0025690 A1 | 1/2013 | Egami | | |

* cited by examiner

*Primary Examiner* — Anita Alanko

(57) ABSTRACT

A gas bearing seal using porous materials for distribution of gas flow can provide site isolation during wet processing. In some embodiments, a flow cell comprises a porous media gas bearing surrounding a periphery of the flow cell, isolating the liquid inside the flow cell from the ambient air outside the flow cell. In some embodiments, a protective chuck comprises a porous media gas bearing disposed in a middle of the protective chuck, isolating the liquid outside the protective chuck with the gaseous ambient generated by the porous media gas bearing.

16 Claims, 16 Drawing Sheets

Flowing a gas to a flow cell, wherein the gas exits a bottom peripheral surface of the flow cell through a porous medium
900

Lowering the flow cell onto the substrate, wherein the bottom peripheral surface of the flow cell is disposed in proximity to a first surface region of the substrate
Wherein the gas flow at the bottom peripheral surface confines a fluid disposed in an interior of the flow cell from spreading to a second substrate surface region outside the first surface region
910

FIG. 9A

Establishing a gas layer between a bottom peripheral surface of a flow cell and a first surface region of a substrate, wherein the gas layer is formed by a gas flow distributed at the bottom peripheral surface through a porous medium
950

Supplying a fluid on the first surface region within the flow cell, wherein the fluid is confined within the flow cell due to the gas layer
960

FIG. 9B

Flowing a gas to an interior of a chuck, wherein the gas exits a bottom surface of the chuck through a porous medium
1500

Lowering the chuck onto the substrate, wherein the bottom surface of the chuck is disposed in proximity to a first surface region of the substrate,
wherein the gas flow at the bottom surface protects the first surface region from a fluid disposed on a second substrate surface region outside the first surface region
1510

FIG. 15A

Establishing a gas layer between a bottom surface of a chuck and a first surface region of a substrate, wherein the gas layer is formed by a gas flow distributed at the bottom surface through a porous medium
1550 supplying a fluid on a second surface region of the substrate, wherein the second surface region is different from the first surface region, and wherein the gas layer protects the first surface region from the fluid on the second surface region
1560

FIG. 15B

TOUCHLESS SITE ISOLATION USING GAS BEARING

This application is related to U.S. application Ser. No. 13/081,914 filed on Apr. 7, 2011, now U.S. Pat. No. 8,783, 273, and entitled "No-Contact Wet Processing Tool with Site Isolation", to U.S. application Ser. No. 13/192,677 filed on Jul. 28, 2011 entitled "No-Contact Wet Processing Tool with Fluid Barrier", to U.S. application Ser. No. 13/194,439 filed on Jul. 29, 2011 entitled "No-Contact Wet Processing Tool with Liquid Barrier", to U.S. application Ser. No. 13/272,041 filed on Oct. 12, 2011, now U.S. Pat. No. 8,715,518, entitled "Gas Barrier with Vent Ring for Protecting a Surface Region from Liquid", and to U.S. application Ser. No. 13/306,767 filed on Nov. 29, 2011, now U.S. Pat. No. 8,728,334, entitled "Dynamic Gas Flow Control of Touchless Interstitial Cells", the disclosures of which are incorporated by reference herein.

FIELD OF THE INVENTION

The present invention relates generally to combinatorial methods for device process development.

BACKGROUND OF THE INVENTION

The manufacture of advanced semiconductor devices entails the integration and sequencing of many unit processing steps, with potential new material and process developments. The precise sequencing and integration of the unit processing steps enables the formation of functional devices meeting desired performance metrics such as power efficiency, signal propagation, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, now U.S. Pat. No. 8,084, 400, claiming priority from Oct. 15, 2005, U.S. patent application Ser. No. 11/419,174 filed on May 18, 2006, now U.S. Pat. No. 8,772,772, claiming priority from Oct. 15, 2005, U.S. patent application Ser. No. 11/674,132 filed on Feb. 12, 2007, now abandoned, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been used in wet chemical processing such as etching and cleaning. HPC processing techniques have also been used in deposition processes such as physical vapor deposition (PVD), atomic layer deposition (ALD), and chemical vapor deposition (CVD).

In standard HPC systems, multiple site isolated regions on a substrate surface can be formed by sealing different regions of the surface, isolating the surface regions from each other. The surface sealing can generate particles, which requires subsequent substrate cleaning. Therefore there is a need for non-contact isolation of surface regions on a substrate surface.

SUMMARY OF THE DESCRIPTION

The invention discloses gas bearing seals to provide site isolation during wet processing using porous materials for distribution of gas flow.

In some embodiments, a flow cell comprises a porous media gas bearing surrounding a periphery of the flow cell, isolating the liquid inside the flow cell from the ambient air outside the flow cell. In some embodiments, a portion of the gas flow from the porous media gas bearing enters the liquid interior of the flow cell. In some embodiments, a gas containment surrounding a periphery of the flow cell can capture the portion of the gas flow from the porous media gas bearing, preventing gas flow from entering the liquid interior of the flow cell.

In some embodiments, a protective chuck comprises a porous media gas bearing disposed in a middle of the protective chuck, isolating the liquid outside the protective chuck with the gaseous ambient generated by the porous media gas bearing. In some embodiments, a portion of the gas flow from the porous media gas bearing enters the liquid outside the protective chuck. In some embodiments, a gas containment surrounding a periphery of the protective chuck can capture the portion of the gas flow from the porous media gas bearing, preventing gas flow from entering the liquid outside the protective chuck.

The protection of the porous media gas bearing is a non contact protection, reducing or eliminating potential damage to the substrate surface due to pressure or friction and reducing or eliminating particles caused by such contact, pressure, or friction. The gas bearing can enable combinatorial processing of a substrate, providing multiple isolated processing regions on a single substrate with different material and processing conditions.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIGS. 9A-9B illustrate exemplary flowcharts for processing site isolated regions according to some embodiments of the present invention.

FIGS. 15A-15B illustrate exemplary flowcharts for processing a substrate using a protective chuck according to some embodiments of the present invention.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The present invention relates to systems and methods for isolating a surface region of a substrate, without contacting the surface, during a wet processing of the remaining surface. The present non-contact isolation can reduce or eliminate particulates or debris, especially at the boundary of the protected region. In some embodiments, the present invention discloses methods and systems for use in high productivity combinatorial processes.

"Combinatorial Processing" generally refers to techniques of differentially processing multiple regions of one or more substrates. Combinatorial processing generally varies materials, unit processes or process sequences across multiple regions on a substrate. The varied materials, unit processes, or process sequences can be evaluated (e.g., characterized) to determine whether further evaluation of certain process sequences is warranted or whether a particular solution is suitable for production or high volume manufacturing.

Figure 1:
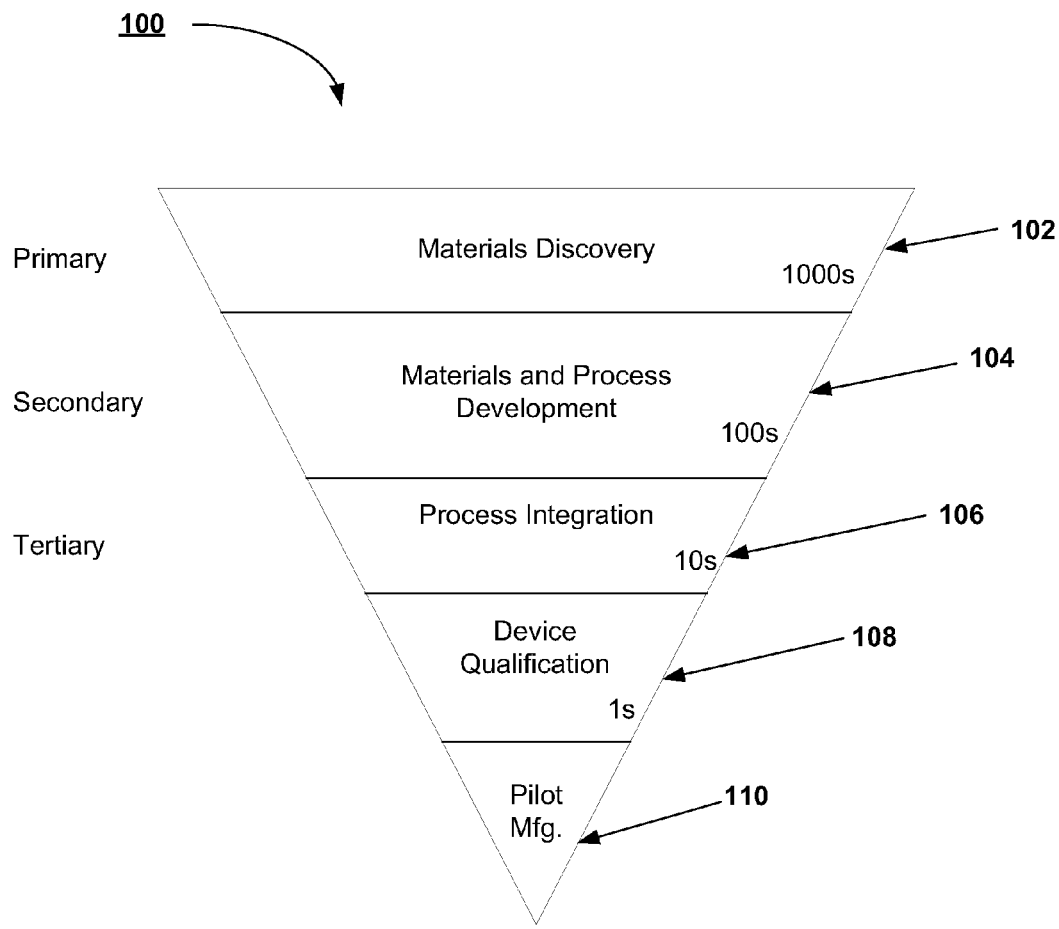
FIG. 1 illustrates a schematic diagram for implementing combinatorial processing and evaluation using primary, secondary, and tertiary screening.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of device fabrication processes by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed. A global optimum sequence order is therefore derived, and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate which are equivalent to the structures formed during actual production of the device. For example, such structures may include, but would not be limited to, gate dielectric layers, gate electrode layers, spacers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
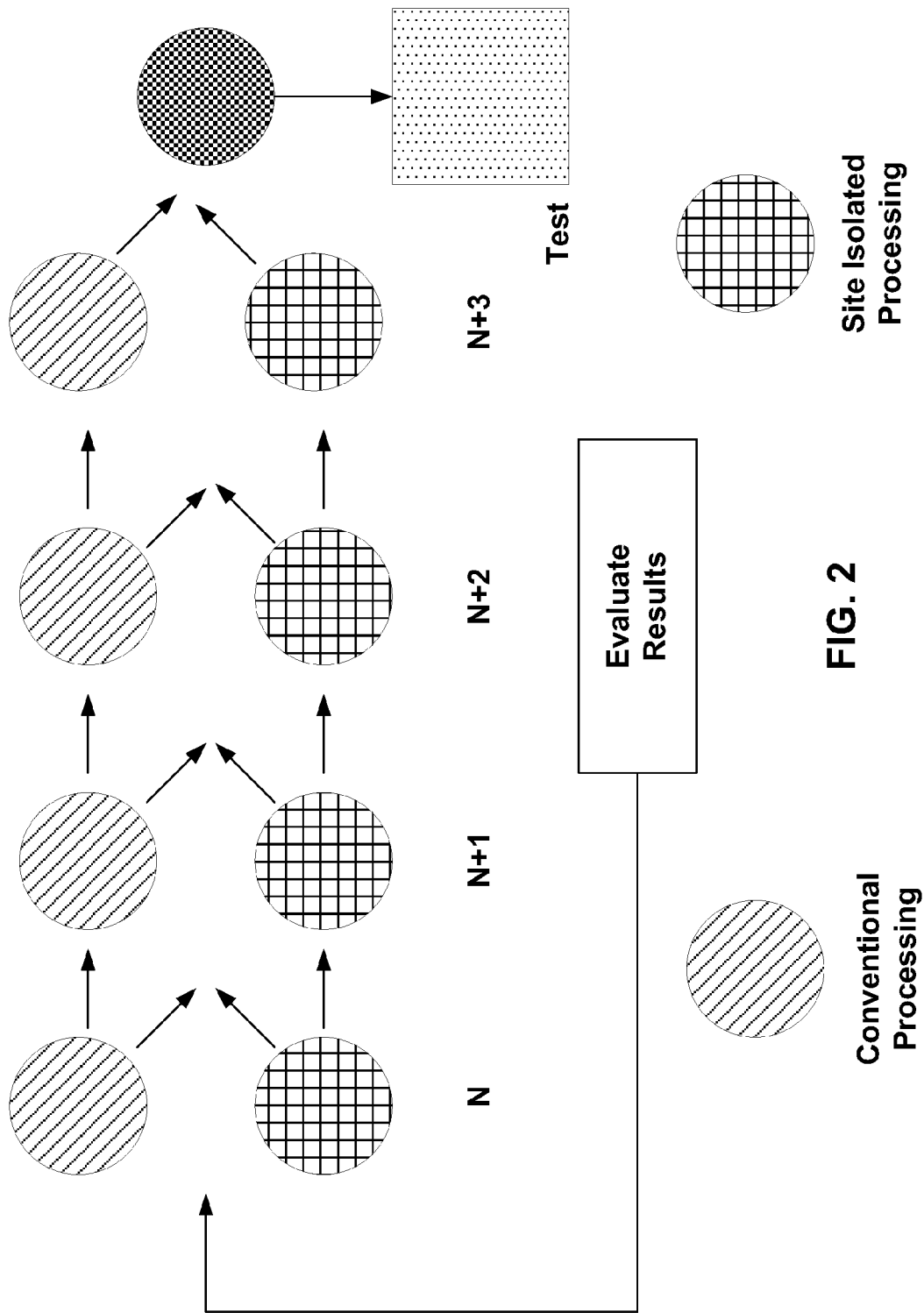
FIG. 2 is a simplified schematic diagram illustrating a general methodology for combinatorial process sequence integration that includes site isolated processing and/or conventional processing in accordance with one embodiment of the invention.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.). Combinatorial processing can be used to determine optimal processing parameters (e.g., time, concentration, temperature, stirring rate, etc.) of wet processing techniques such as wet etching, wet cleaning, rinsing, and wet deposition techniques (e.g., electroplating, electroless deposition, chemical bath deposition, etc.).

Figure 3:
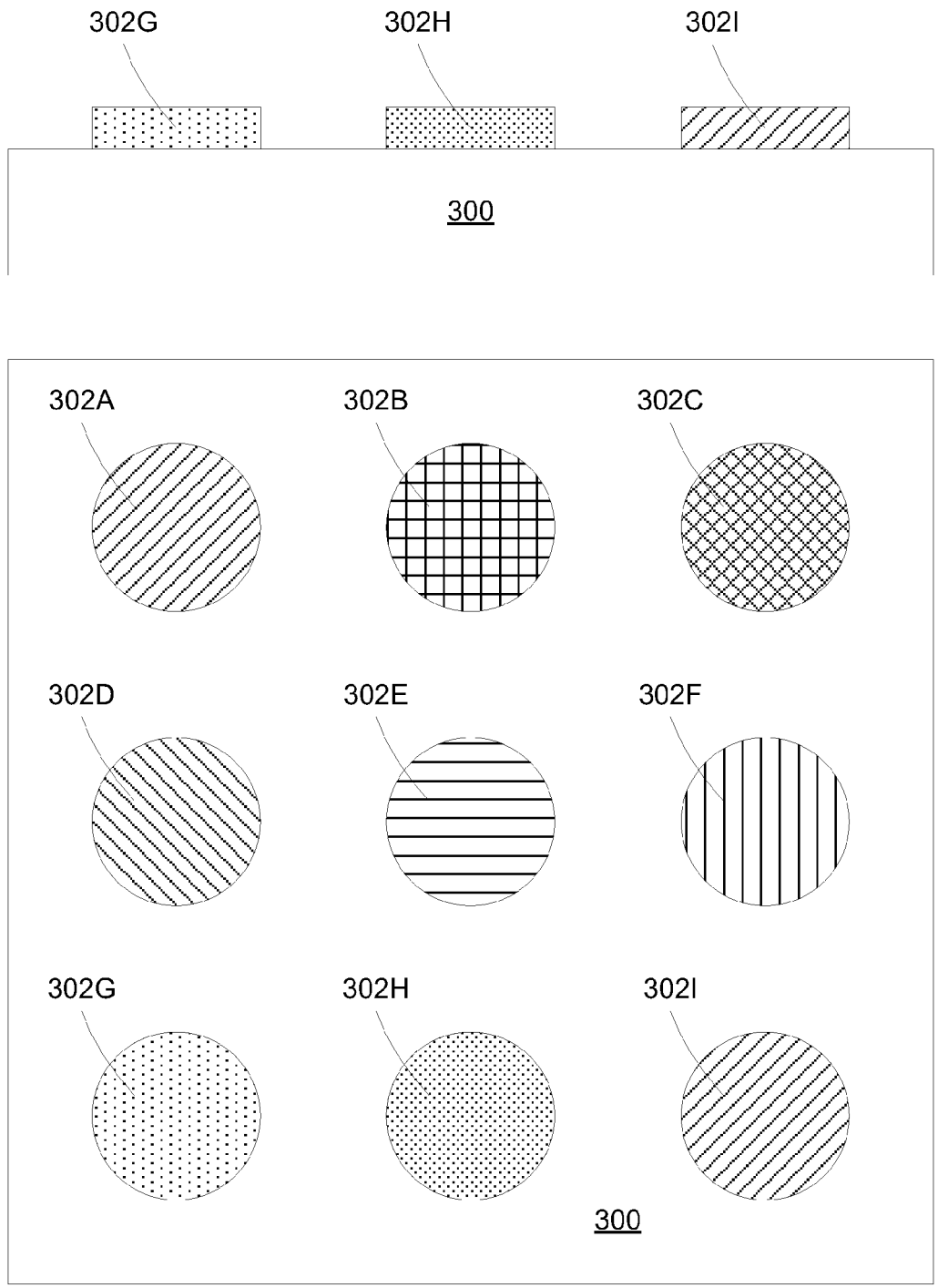
FIG. 3 illustrates a schematic diagram of a substrate that has been processed in a combinatorial manner.

FIG. 3 illustrates a schematic diagram of a substrate that has been processed in a combinatorial manner. A substrate, 300, is shown with nine site isolated regions, 302A-302I, illustrated thereon. Although the substrate 300 is illustrated as being a generally square shape, those skilled in the art will understand that the substrate may be any useful shape such as round, rectangular, etc. The lower portion of FIG. 3 illustrates a top down view while the upper portion of FIG. 3 illustrates a cross-sectional view taken through the three site isolated regions, 302G-302I. The shading of the nine site isolated regions illustrates that the process parameters used to process these regions have been varied in a combinatorial manner. The substrate may then be processed through a next step that may be conventional or may also be a combinatorial step as discussed earlier with respect to FIG. 2.

Figure 4:
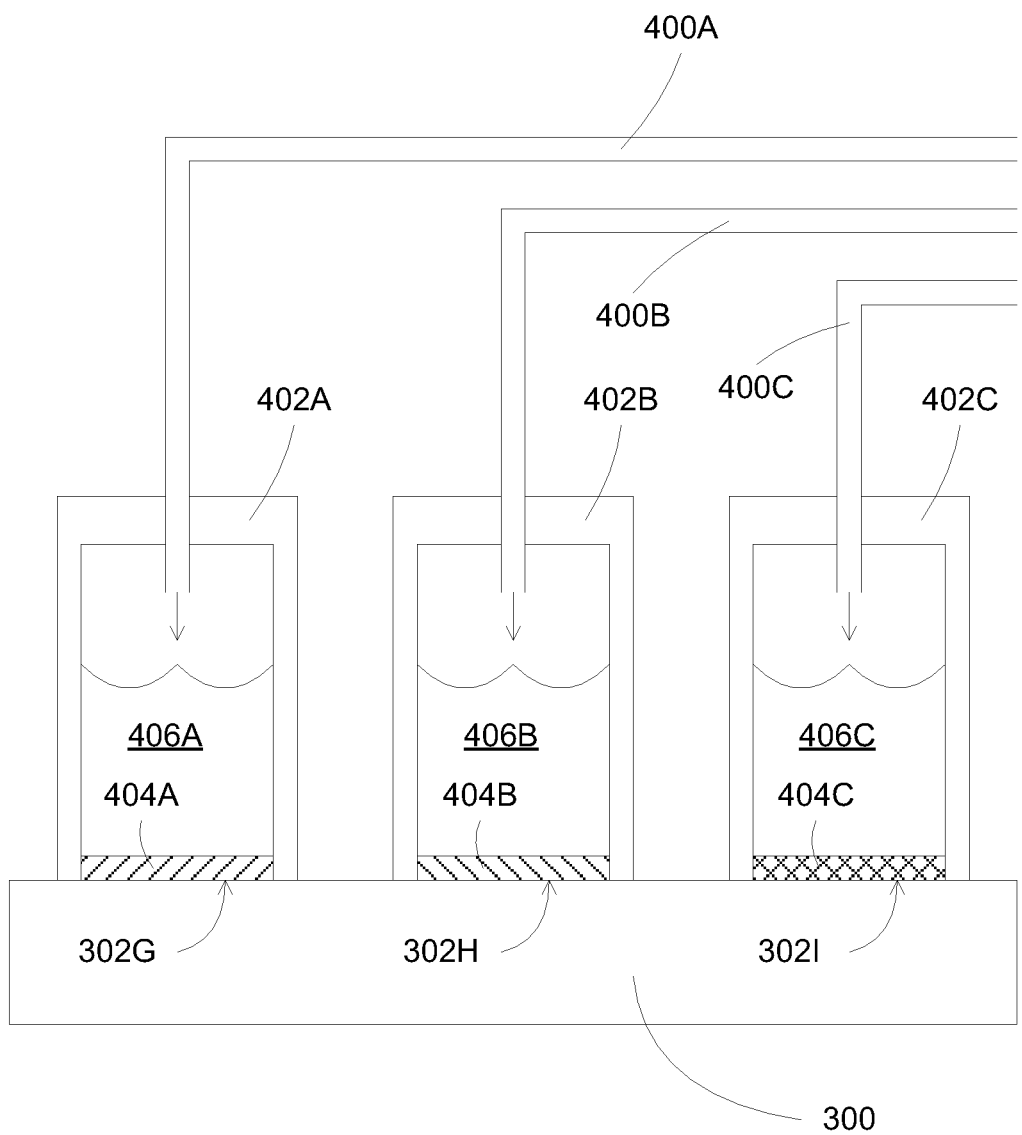
FIG. 4 illustrates a schematic diagram of a combinatorial wet processing system according to an embodiment described herein.

FIG. 4 illustrates a schematic diagram of a combinatorial wet processing system according to an embodiment described herein. A combinatorial wet system may be used to investigate materials deposited by solution-based techniques. An example of a combinatorial wet system is described in U.S. Pat. No. 7,544,574 cited earlier. Those skilled in the art will realize that this is only one possible configuration of a combinatorial wet system. FIG. 4 illustrates a cross-sectional view of substrate, 300, taken through the three site isolated regions, 302G-302I similar to the upper portion of FIG. 3. Solution dispensing nozzles, 400a-400c, supply different solution chemistries, 406A-406C, to chemical processing cells, 402A-402C. FIG. 4 illustrates the deposition of a layer, 404A-404C, on respective site isolated regions. Although FIG. 4 illustrates a deposition step, other solution-based processes such as cleaning, etching, surface treatment, surface functionalization, etc. may be investigated in a combinatorial manner. Advantageously, the solution-based treatment can be customized for each of the site isolated regions.

The ability to conduct multiple experiments on a single substrate without introducing particles, pattern collapse, or other forms of defects or contamination is generally required to improve yield, for example, to reinsert the substrates into a fabrication facility, production line, metrology center, etc.

It would be advantageous to form an effective barrier between the walls of the chemical processing cell and the substrate surface without physically contacting the surface. In some embodiments, the present invention discloses a "touch-less" or "no-contact" seal using a gas bearing. A gas bearing is typically used for frictionless motion of stages and other mechanisms, but the inherent floating or levitating characteristics would also be effective at preventing a reactor, process cells, isolation cell, sleeves, etc, from contacting a wafer surface. The low fly height (typically 5-20 microns) would also form an effective barrier against fluid intrusion. The gas bearing could be a nozzle type, with one or more discrete ports to supply the suspension air or gas.

In some embodiments, the gas bearing can be a porous media type, with multiple microscopic holes distributing the suspension air or gas more evenly. Because the suspension gas escapes at the bearing edges, a containment or vent ring can be used to prevent bubbling, foaming, or otherwise entraining gas into the fluid. Preliminary experiments with porous media gas bearings show these are extremely effective at forming a complete seal to protect a site isolated region while the surrounding area is cleaned with a process fluid. Dry experiments also show that a multi-cell assembly could be coupled to a wafer surface and leave little to no particles behind.

Figure 5A:
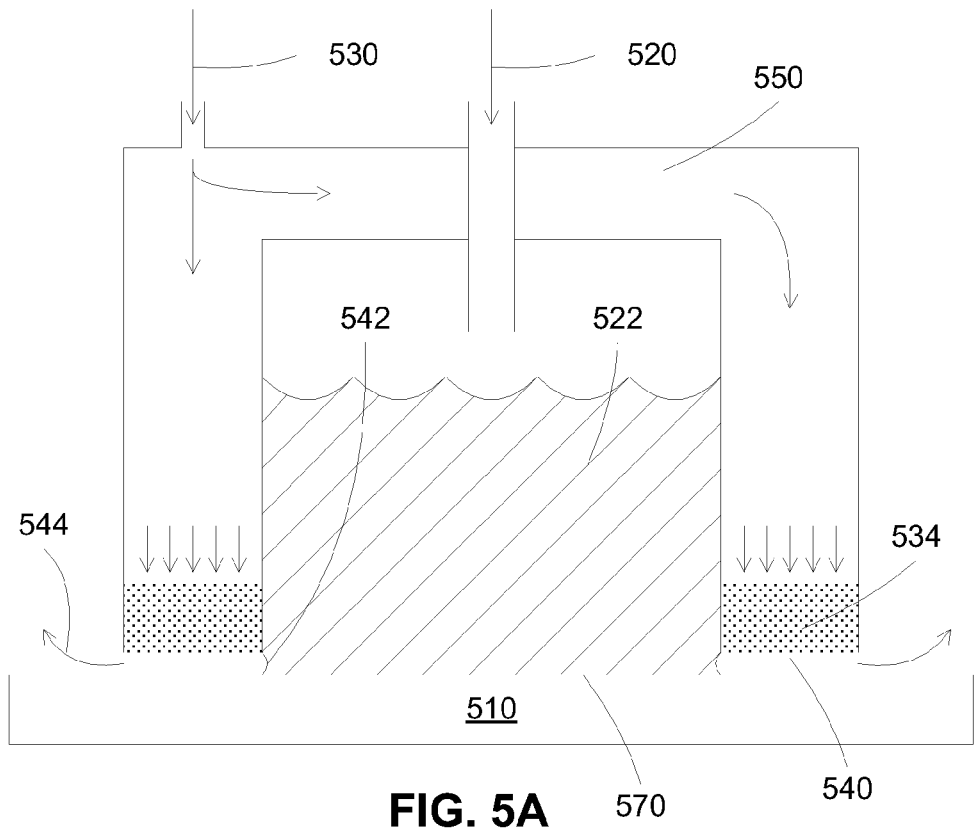
FIGS. 5A-5B illustrate an exemplary reactor according to some embodiments of the present invention.
Figure 5B:
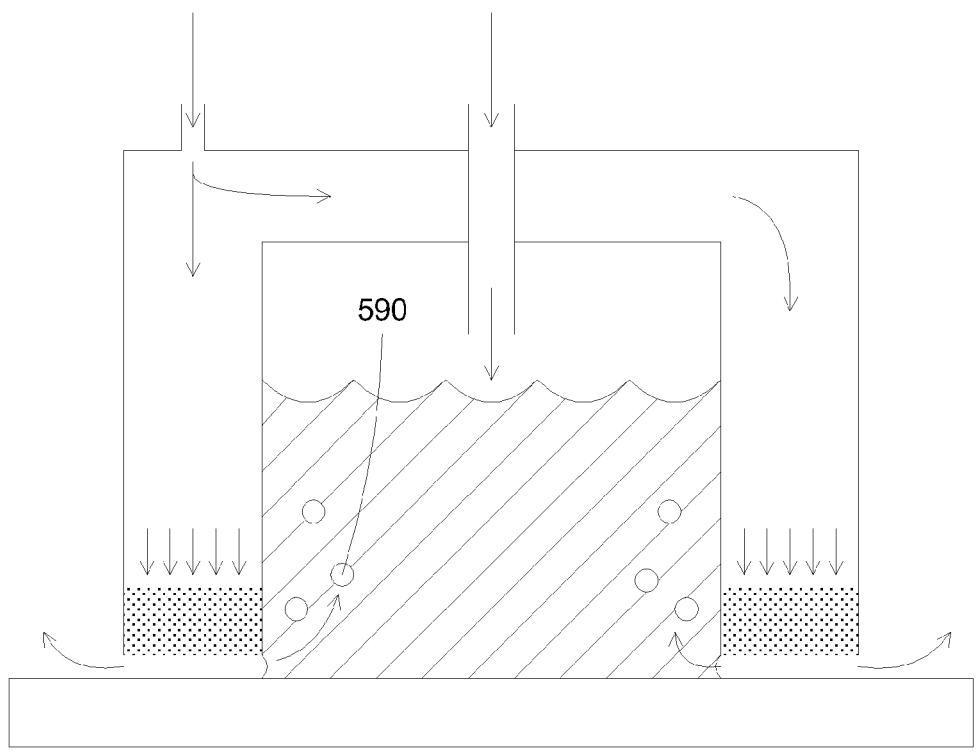

FIGS. 5A-5B illustrate an exemplary reactor according to some embodiments of the present invention. A wet processing unit or reactor 550 is disposed on a substrate 510 without touching the substrate surface due to a gas layer 540 formed between the bottom surface of the reactor 550 and the substrate surface. A gas flow 530 enters the reactor, and exits at the bottom surface, through a porous media 534, forming the gas layer 540. In some embodiments, the gas layer 540 can levitate the reactor 550 above the substrate 510. In some embodiments, a separate levitation mechanism, such as a magnetic levitation, can be used.

Processing liquid 522 can be provided to the interior of the reactor, for example, through a liquid flow 520. The substrate surface outside of the reactor is typically exposed to air ambient, and thus can provide an exhaust 544 for the gas layer 540. The gas layer can also form a liquid-gas interface 542 with the processing liquid 522 within the reactor (FIG. 5A). For high pressure of the gas layer, gas bubbles 590 can escape to the processing liquid (FIG. 5B). Alternatively, for low pressure, processing liquid can enter the gas layer 540.

The reactor 550 may then perform any of numerous wet processing methods on the surface region 570 of the substrate. Examples of wet processes include wet cleanings, wet etches and/or strips, and electroless depositions. These methods may generally be performed by providing various processing fluids (i.e., liquids, gases, or a combination thereof) to the interior of the wet processing unit from the processing fluid supply system 520. Because of the sealing action of the gas layer 540, along with the multiple, individual liquid in each reactor volume 522, separate and unique wet processes may be performed simultaneously on the different surface regions of the substrate, as the volume (or body) of liquid (and/or gas) held in each liquid reactor 550 is isolated from the others. The portions of the substrate 510 between the regions 570 processed by multiples reactor 550 remain dry.

In operation, after the wet processing reactor 550 is lowered on a substrate, a wet process is performed on the surface region 570 of the substrate within the interior volume of the reactor. In order to create a barrier around the region 570, a gas flow, such as argon or nitrogen gas, is delivered to the porous media 534, where it flows both inwards towards the center of the respective region 570 and outwards, away from the region 570. This gas flow creates an annular gas barrier around the respective region 570 on the substrate that confines the processing fluid (e.g., a liquid) on the substrate region 570.

A processing fluid (e.g., a liquid), such as a cleaning solution, is then delivered to the central conduit. The liquid flows onto the respective region 570 on the substrate 510, where it is restricted from flowing outward onto the surrounding surface portion of the substrate 510 by the gas barrier. As such, as the processing liquid continues to flow into the central conduit 520, a column of liquid 522 is formed within the isolation volume over the respective region 570 of the substrate 510.

After a predetermined amount of time (i.e., depending on the particular wet process being performed), the liquid may be removed from the reactor, for example, by a vacuum supply. As such, the present invention allows for wet processes to be performed on only particular portions of the substrate, without any of the components of the reactors 550 contacting the upper surface of the substrate. Thus, the likelihood that any contaminates will be left on the substrate are reduced.

Thus, in some embodiments, a substrate processing tool is provided. The substrate processing tool includes a housing defining a chamber. A substrate support is coupled to the housing and configured to support a substrate within the chamber. The substrate has an upper surface with a first portion and a second portion surrounding the first portion. A site isolation reactor including a body is coupled to the housing and positioned within the chamber above and spaced apart from the first portion of the upper surface of the substrate. The body includes at least one porous media outlet on a lower surface thereof. At least one gas flows to the porous media outlet and is configured to form a gas layer around the first portion of the upper surface of the substrate.

Figure 6A:
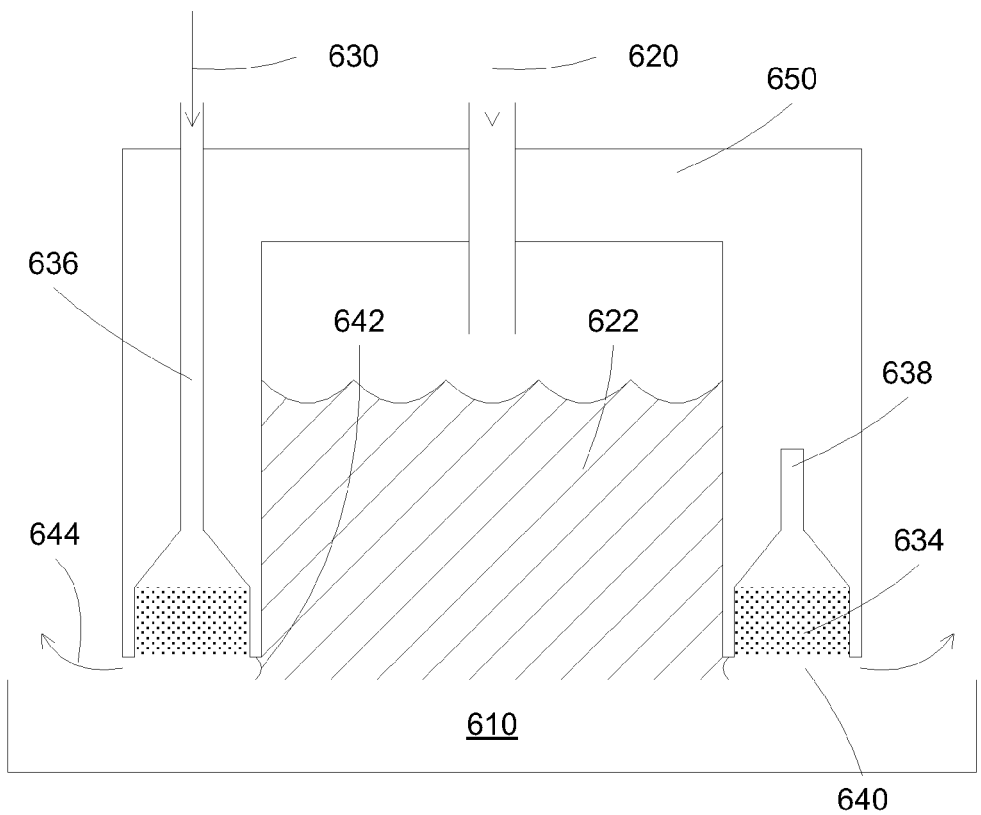
FIGS. 6A-6B illustrate another exemplary reactor according to some embodiments of the present invention.
Figure 6B:
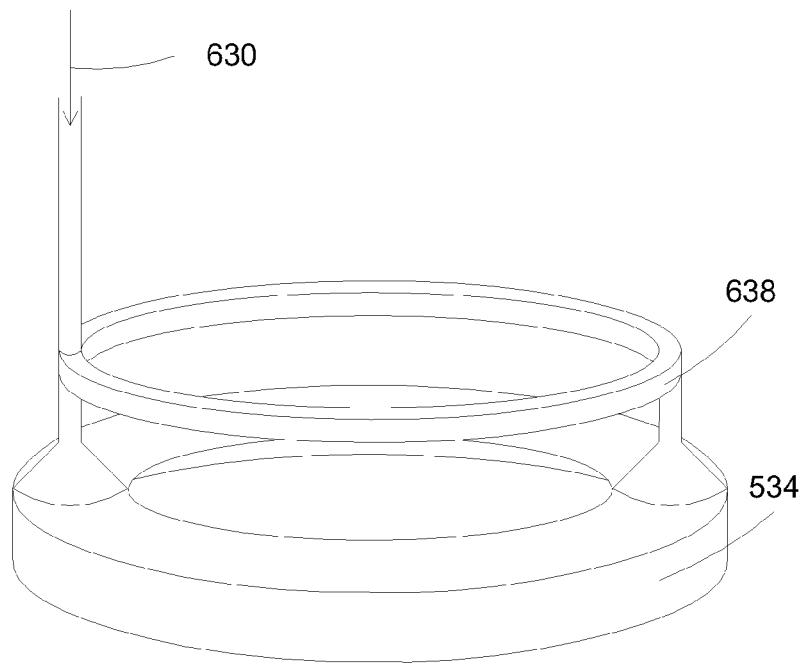

FIGS. 6A-6B illustrate another exemplary reactor according to some embodiments of the present invention. A reactor 650 is disposed on a substrate 610 without touching the substrate surface due to a gas layer 640 formed between the bottom surface of the reactor 650 and the substrate surface. A gas flow 630 enters the reactor, and exits at the bottom surface, through a porous media 634, forming the gas layer 640.

Processing liquid 622 can be provided to the interior of the reactor, for example, through a liquid flow 620. The substrate surface outside of the reactor is typically exposed to air ambient, and thus can provide an exhaust 644 for the gas layer 640. The gas layer can also form a liquid-gas interface 642 with the processing liquid 622 within the reactor. In some embodiments, the porous media 634 can has a ring shape, disposed in a bottom peripheral of the reactor. A gas conduit 636 can deliver the gas flow 630 to the porous media 634, for example, through a ring 638. Other shapes of the porous media 534 can also be used, for example, separate portions of the porous media disposed at the bottom surface of the reactor.

Figure 7A:
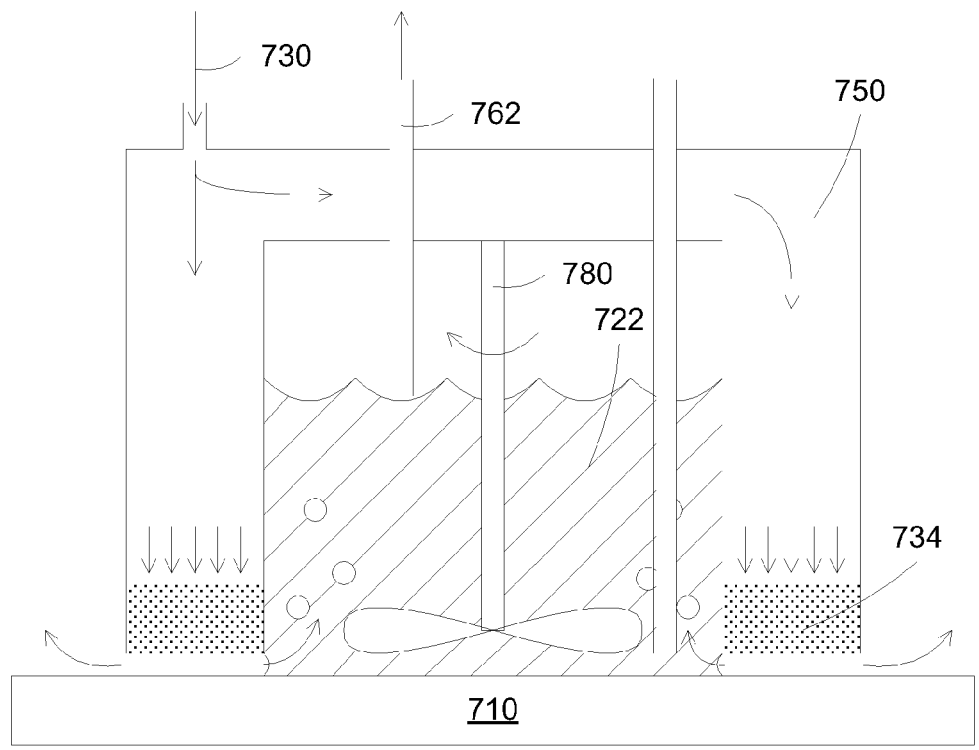
FIGS. 7A-7B illustrate another exemplary reactor according to some embodiments of the present invention.
Figure 7B:
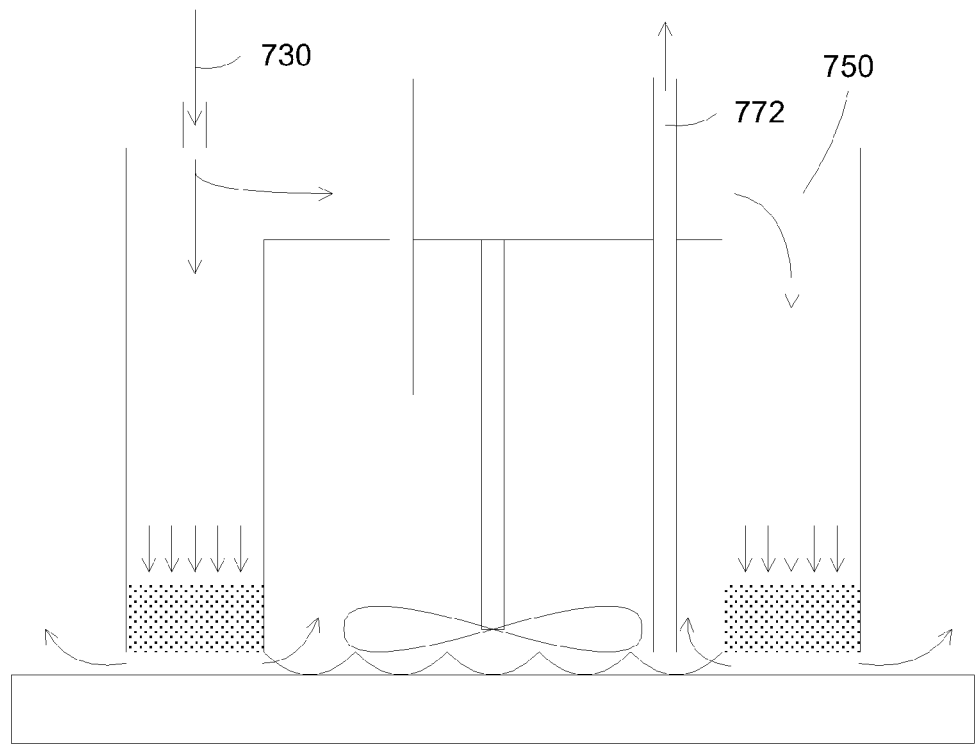

FIGS. 7A-7B illustrate another exemplary reactor according to some embodiments of the present invention. A reactor 750 is disposed on a substrate 710 without touching the substrate surface due to a gas layer formed between the bottom surface of the reactor and the substrate surface. A gas flow 730 enters the reactor, and exits at the bottom surface, through a porous media 734. A stirrer 780 can be provided for stirring the processing liquid 722. A vacuum conduit 762 can be included to control the level of the processing liquid, for example, by evacuating the liquid 722 when the liquid level exceeds the opening of vacuum exhaust 762 (FIG. 7A). A vacuum conduit 772 can be included to evacuate the processing liquid 722, for example, when processing in completed.

Figure 8A:
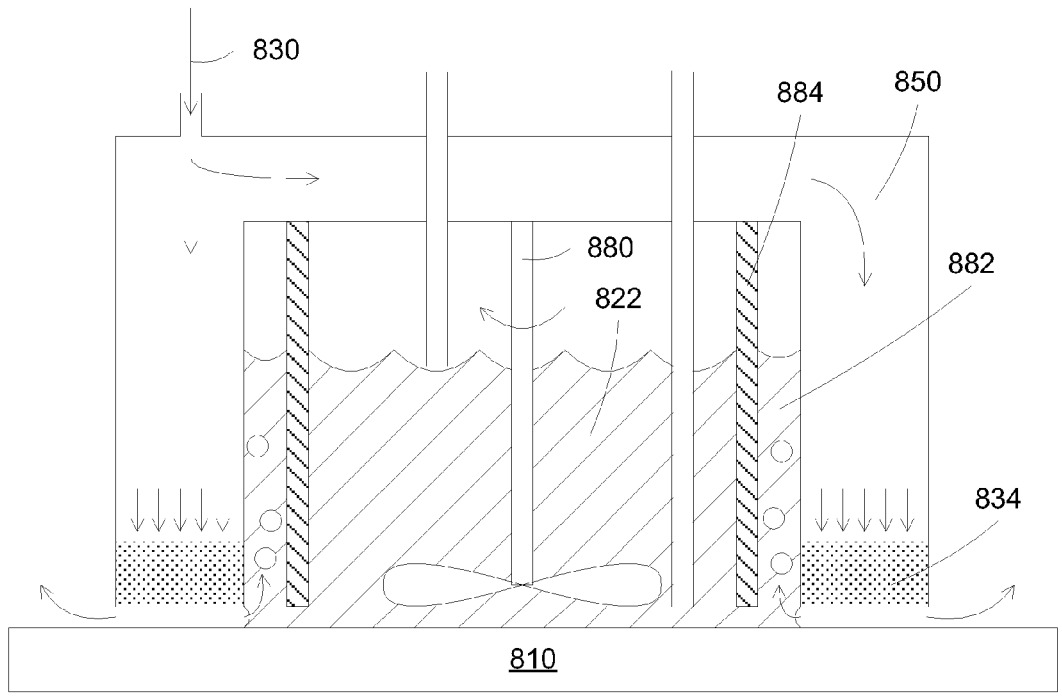
FIGS. 8A-8B illustrate another exemplary reactor according to some embodiments of the present invention.
Figure 8B:
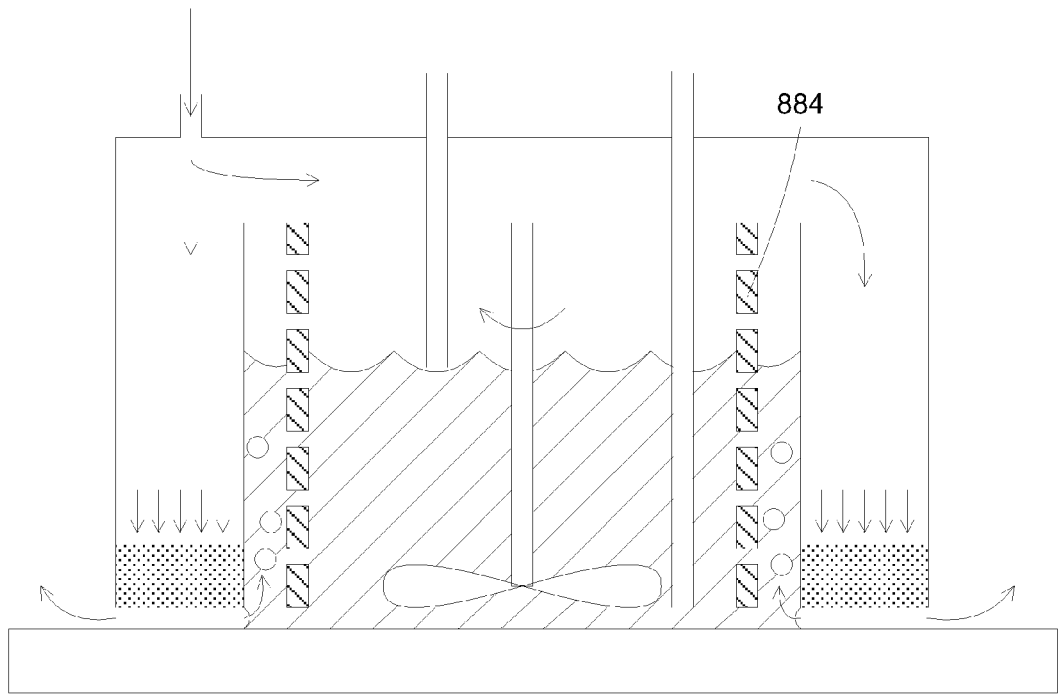
Figure 8C:
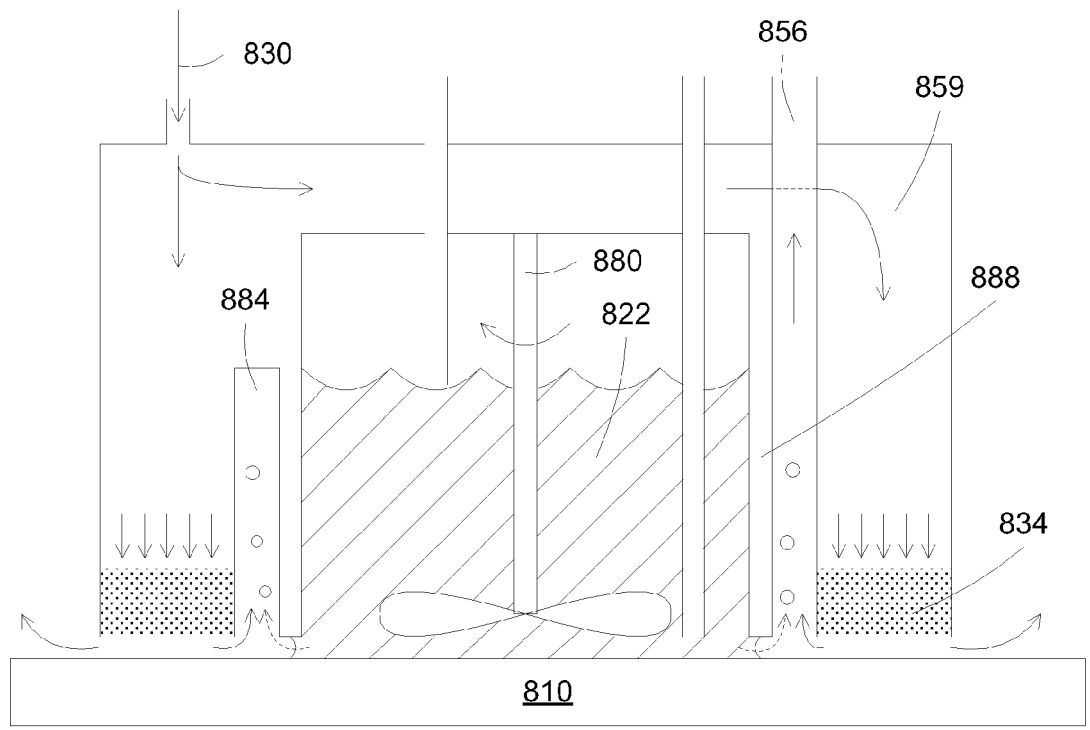

FIGS. 8A-8C illustrate other exemplary reactors according to some embodiments of the present invention. A reactor 850 is disposed on a substrate 810 without touching the substrate surface due to a gas layer formed between the bottom surface of the reactor and the substrate surface. A gas flow 830 enters the reactor, and exits at the bottom surface, through a porous media 834. A stirrer 880 can be provided for stirring the processing liquid 822. An isolation wall 884 can be provided at a peripheral of the reactor interior to confine any bubbles to the outer liquid region 882 therein. The processing liquid 822 thus can be isolated from any bubble disturbance caused by exhausted gas or fluctuation in pressure of the gas layer.

The isolation wall can be a solid wall 884 (FIG. 8A) or a perforated wall 884 (FIG. 8B) to allow any equalization of liquid within the reactor interior volume. The isolation wall is preferably disposed near the interior wall of the reactor, surrounding the porous media 834.

Figure 8D:
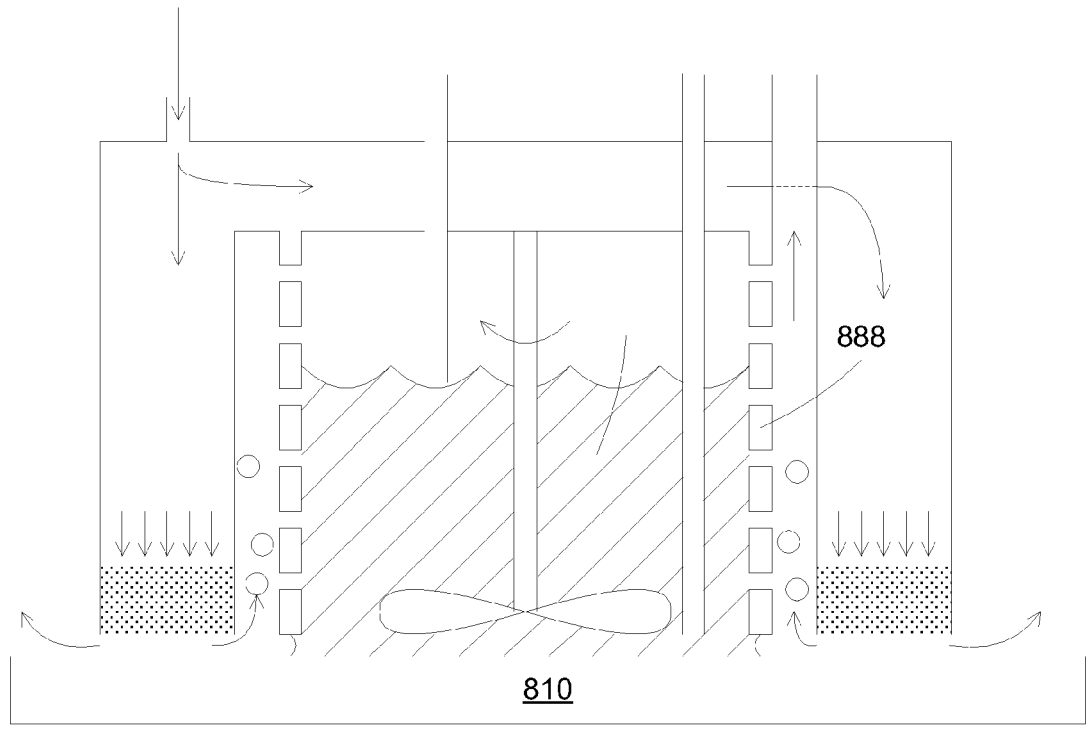

FIG. 8C illustrates another exemplary reactor according to some embodiments of the present invention. A reactor 859 is disposed on a substrate 810 without touching the substrate surface due to a gas layer formed between the bottom surface of the reactor and the substrate surface. A gas flow 830 enters the reactor, and exits at the bottom surface, through a porous media 834. A gas containment ring 888 can be provided at a peripheral of the reactor interior to prevent the exhausted gas from entering the reactor cell and the liquid 822 therein. Any liquid that enters the gas containment area 884 would be entrained in the gas flow as droplets and returned to the reactor interior via a spill way or vapor trap in order to minimize the process chemistry consumption during the process. The containment ring can be a solid containment ring 888 (FIG. 8D) or a perforated ring 888 (FIG. 8D) to allow any equalization of liquid within the reactor interior volume. Alternatively, the containment ring can be part of the reactor wall, which comprises a containment ring at an inner peripheral portion and a porous element disposed at an outer peripheral portion.

In some embodiments, the present invention discloses a method for processing a substrate using a reactor comprising a porous media to form a gas layer. FIGS. 9A-9B illustrate exemplary flowcharts for processing site isolated regions according to some embodiments of the present invention. In FIG. 9A, operation 900 flows a gas to a flow cell, wherein the gas exits a bottom peripheral surface of the flow cell through a porous medium. Operation 910 lowers the flow cell onto the substrate, wherein the bottom peripheral surface of the flow cell is disposed in proximity to a first surface region of the substrate, wherein the gas flow at the bottom peripheral surface confines a fluid disposed in an interior of the flow cell from spreading to a second substrate surface region outside the first surface region. In some embodiments, the gas flow at the bottom surface causes the flow cell to be levitated above the first surface region.

In some embodiments, the method further comprises processing the first surface region; controlling the gas flow to achieve a boundary region between the fluid and the gas flow; dynamically regulating the flow of the gas; adjusting the flow of the gas flow; or regulating the flow of the gas to minimize bubbles inward to the fluid.

In FIG. 9B, operation 950 establishes a gas layer between a bottom peripheral surface of a flow cell and a first surface region of a substrate, wherein the gas layer is formed by a gas flow distributed at the bottom peripheral surface through a porous medium. Operation 960 supplies a fluid on the first surface region within the flow cell, wherein the fluid is confined within the flow cell due to the gas layer. In some embodiments, the gas flow at the bottom surface causes the flow cell to be levitated above the first surface region.

In some embodiments, the method further comprises processing the first surface region; flowing a gas to an interior of the flow cell to form the gas flow distributed at the bottom peripheral surface of the flow cell; dynamically regulating the gas flow; adjusting the gas flow; regulating the flow of the gas to minimize bubbles inward to the fluid; controlling a conductance of a gas flow path to control a gas pressure of the gas layer; measuring a gas pressure of the gas layer; dynamically regulating the gas flow to achieve a gas pressure of the gas layer; adjusting a gas flow to achieve a gas pressure of the gas layer; adjusting a gas flow path conductance to achieve a gas pressure of the gas layer; measuring a gas pressure between the bottom of the protective chuck and the region surface; dynamically regulating the gas flow to achieve a gas pressure of the gas layer.

In some embodiments, the site isolated regions are the areas of interest in a combinatorial process, since they provide the variations of process and material parameters, which can be evaluated to obtain the optimum device structures and fabrication processes. In some embodiments, the surface areas outside the isolated regions are also processed, such as, to clean or etch the outside surface area. For example, to clean the outside surface areas with a wet cleaning fluid, the isolated regions are protected and cleaning chemical is introduced to the substrate surface.

In some embodiments, selective portions of the substrate surface can be processed, for example, a substrate surface processing at regions outside the regions protected by a chuck. For example, multiple site isolate regions on the substrate are protected from an outside fluid. The surface region on the substrate is formed without any physical contact with the substrate, preventing any generation of particulates or debris caused by contact friction.

In some embodiments, the substrate surface is covered with a fluid, for example, to clean or wet etch the substrate surface. The present non-contact protected surface regions can allow the exclusion of certain surface areas on the substrate from being similarly processed by the fluid without any potential damage caused by added particles.

In some embodiments, a protective chuck can be disposed on a surface region of a substrate with a gas layer in between. The gas comprises a gas layer with adequate gas pressure to levitate the protective chuck about the substrate surface, preventing the protective chuck from contacting the substrate, and to form a barrier region, blocking the outside fluid.

In some embodiments, the present invention relates to non-contact blockage of regions on a substrate surface using gas layers. A protective chuck having a gas layer at a bottom surface can block surrounding fluid from entering the region under the chuck bottom surface. The gas layer can be established by having a flowing gas flowing across the bottom surface, through a gas inlet and an exhaust outlet. The pressure of the gas layer can be controlled by the gas flow rate and by the exhaust conductance.

Figure 10A:
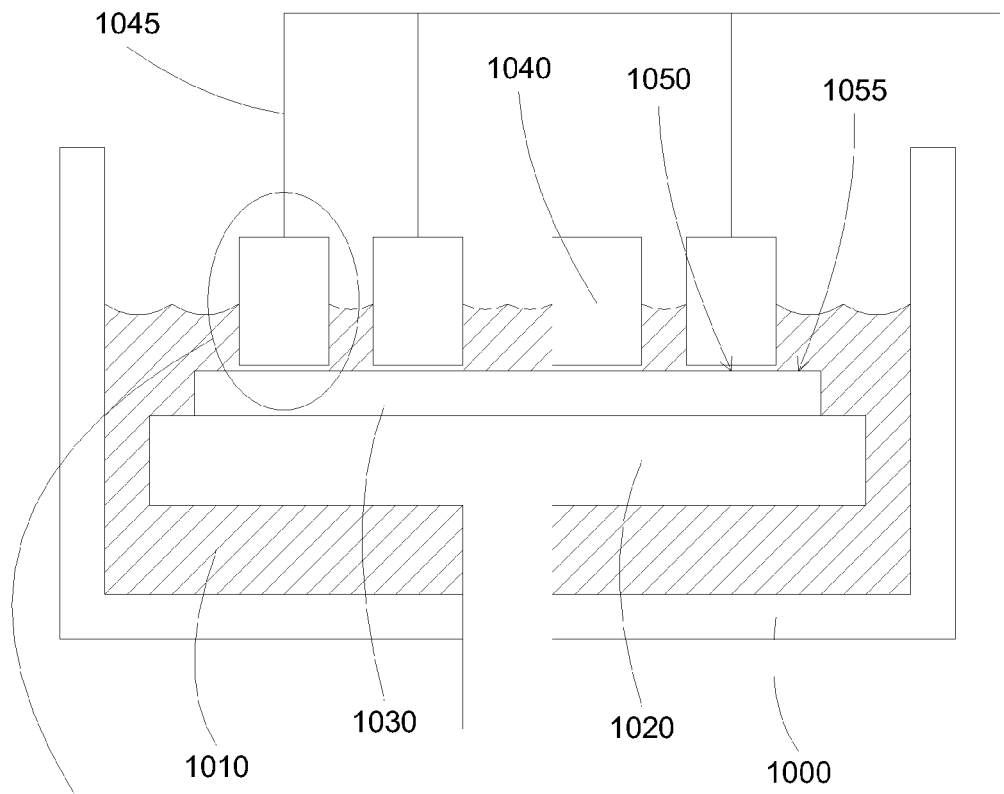
FIGS. 10A-10B illustrate an exemplary surface protection with gas layer according to some embodiments of the present invention.
Figure 10B:
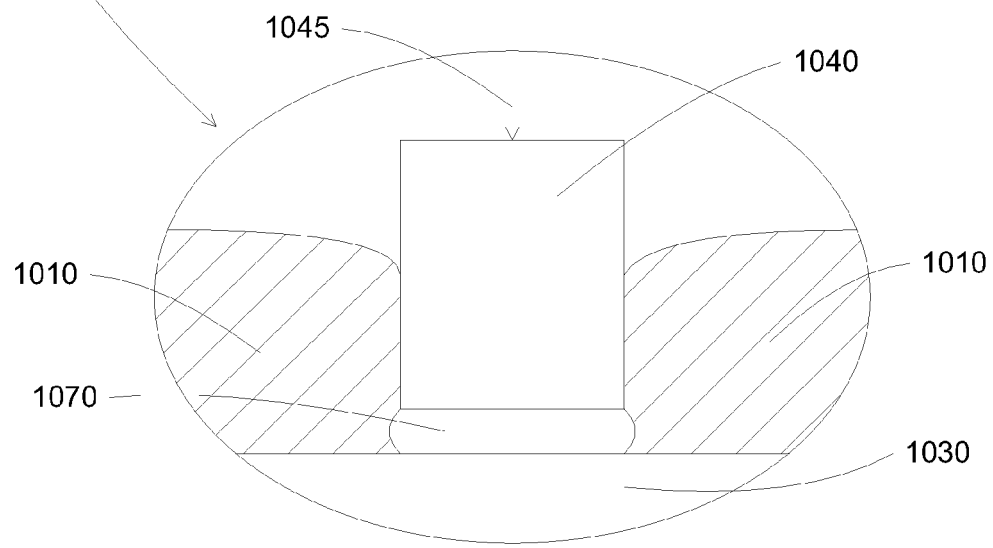

FIGS. 10A-10B illustrate an exemplary surface protection with gas layer according to some embodiments of the present invention. In FIG. 10A, a process chamber 1000 supports a chuck 1020 having a substrate 1030 disposed thereon. The substrate 1030 is submerged in a processing fluid 1010, for example, a cleaning fluid, a rinsing fluid, or an etching fluid. The process chamber 1000 can be a part of a HPC system, which comprises a plurality of protective chucks 1040 protecting isolated regions 1050 of the substrate. Gas lines 1045 can be supplied to the protective chucks 1040, for example, to pressurize the inside of the protective chucks 1040 against the surrounding fluid 1010. The surface area 1055 of the substrate, outside the protected isolated regions 1050, is processed by the processing fluid 1010.

FIG. 10B shows an exemplary configuration of a protective chuck 1040 protecting surface 1050 regions of the substrate 1030 against the fluid processing 1010. A gas layer 1070 is formed under the protective chuck 1040, for example, with supplied gas coming from gas inlet 1045. The gas layer 1070 forms a pressurized layer, preventing the fluid 1010 from entering the surface region 1050. The fluid 1010 thus stays within the surface region 1055, outside the region 1050. The gas layer 1070 provides a non-contact protection of the region 1050, eliminating any particle or debris generation due to abrasive contacts.

In some embodiments, the protective chuck comprises a porous material disposed on a bottom surface, e.g., the surface to be disposed in proximity with the substrate surface. The porous material can form the flat bottom surface, which then form a substantially uniform gap with the substrate, enabling a gas flow across the flat bottom surface to create a gas layer through a higher pressure gas layer than the outside ambient.

Figure 11A:
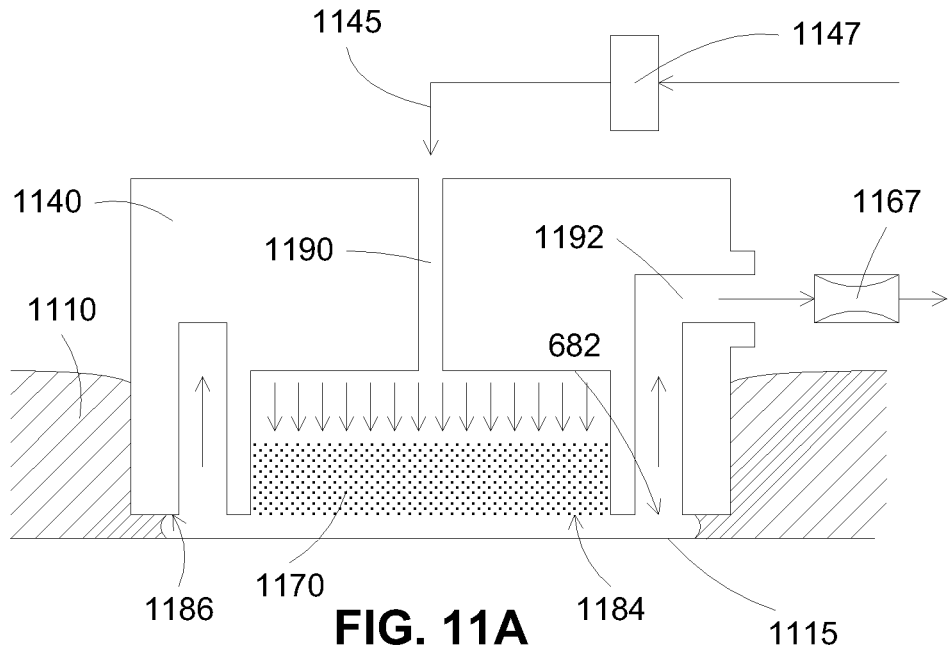
FIGS. 11A-11B illustrate an exemplary protective chuck according to some embodiments of the present invention.
Figure 11B:
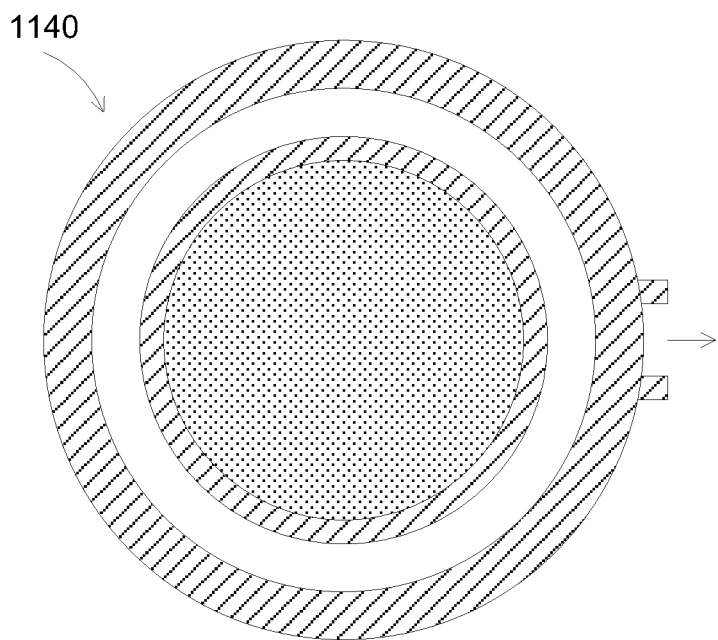

FIGS. 11A-11B illustrate an exemplary protective chuck according to some embodiments of the present invention. FIG. 11A shows a cross section side view and FIG. 11B shows a bottom view of the protective chuck 1140. The protective chuck 1140 comprises a flat porous material 1170, having bottom surface 1184, to be disposed in close proximity with the substrate surface 1115.

In some embodiments, the bottom surface of the protective chuck comprises two substantially flat areas: an outer substantially flat area 1186 surrounding a peripheral of the bottom surface and an inner substantially flat area 1184 from the porous material 1170. A gas flow 1145 through a flow controller 1147 can provide a flow of gas through a first conduit 1190 to the porous material 1170, establishing a gas layer, which can act as a gas bearing between the protective chuck 1140 above the substrate surface 1115.

The protective chuck can comprise first and second conduits 1190 and 1192 to form an inlet and an outlet of a gas flow. Coupling can be provided at the end of the conduits at the outside surface for ease of connection to an external gas flow assembly. One conduit can serve as a gas inlet, and the other conduit served as a gas outlet. For example, the first conduit 1190 can accept a gas input flow through a coupling to a gas source 1145, preferably through a flow meter 1147 to measure the gas flow, or a flow controller to control the gas flow. The second conduit 1192 can be left open, forming a vent ring that releases the gas output flow to atmosphere. A restricting valve or orifice 1167 can be coupled to the gas output flow, for example, externally to the protective chuck after the gas outlet, or internally within the second conduit, to regulate a flow resistance, or a flow conductance, of the gas flow, effectively affecting the gas pressure at the gas layer. For example, with a same gas flow at the first conduit inlet, a more restricted second conduit would increase the gas pressure at the gas layer. Other configurations can also be used, such as a ring of porous material or a discrete distribution of porous material in the bottom surface 1184.

In some embodiments, the gas flow between the first and second conduits through the porous material forms a gas layer that levitates the protective chuck and protects the surface region of the substrate from a fluid disposed on the substrate outside the surface region. Higher gas flow can increase a lift force, providing a larger air gap between the protective chuck and the substrate surface. More restricted outlet conduit can increase a gas pressure at the air gap, protecting the surface region under the protective chuck from the outside fluid. In some embodiments, other means to levitating the protective chuck can be used, such as magnetic levitation or electric repulsion.

During processing, a liquid 1110 is introduced to a region on the substrate surface, outside the region covered by the bottom surface of the chuck. The gas layer can prevent the liquid 1110 from reaching the substrate surface region under the bottom surface of the chuck. The liquid can be a processing liquid, for example, an etch solution to etch a layer on the substrate. Since the substrate surface region under the chuck is protected by the gas bearing, the etching process only etches the substrate surface outside the chuck area. After finish processing, the liquid 1110 is drained, e.g., removed from the substrate surface.

In some embodiments, the substrate can be processed using a protective chuck configured for forming a gas bearing at a bottom surface of the protective chuck. After supplying a gas flow to the protective chuck to create a gas flow along the bottom surface, the protective chuck is lowered onto a substrate. Under appropriate conditions, such as proper gas flow and air gap between the bottom surface of the protective chuck and the substrate surface, the gas flow can cause the protective chuck to be levitated above the substrate surface, forming a surface region on the substrate that is protected by the gas layer against a fluid disposed on the substrate surface outside the surface region.

In some embodiments, the gas flow to the protective chuck exits at a first location on the bottom surface, releasing to the air ambient. The first location can be disposed at a middle area of the bottom surface, and preferably configured to be distributed along a peripheral of a center area for uniform flowing across the bottom surface area. Upon approaching the substrate surface, the gas flow runs along the gap between the bottom surface of the protective chuck and the substrate surface. Upon encountered and blocked by the outside fluid, the gas flow escapes through a second location on the bottom surface. The second location can be disposed at a peripheral of the bottom surface, and preferably surrounding the bottom surface, leaving a small bottom surface ring around the outer edge of the protective chuck.

In some embodiments, the protective chuck protects the surface region from the fluid without contacting the surface region. The gas flow of the gas layer can be configured to balance the fluid flow, forcing the fluid to stay outside the surface region protected by the protective chuck. The boundary between the gas layer and the outside fluid can be at the outer edge of the protective chuck, or can be somewhat inside the edge, depending on the gas flow. At high flow, the gas can exert a strong force against the fluid, with some gas entering the fluid, forming bubbles at the area surrounding and outside the protective chuck. At low flow, the fluid pushes into the protected area, with some fluid mixing with the gas at the gas exhaust location, forming bubbles at the area surrounding and inside the protective chuck.

In some embodiments, the flow of the gas to the bottom surface of the protective chuck and/or the resistance or conductance of the gas flow path is controlled to achieve a desired gas layer, and effectively a desired boundary region between the fluid outside the surface region and the gas within the surface region. A desired gas flow can be used, establishing a gas layer that forms a fluid-gas boundary at the outer edge of the protective chuck, without any bubbles inside or outside of the protected area.

Figure 12A:
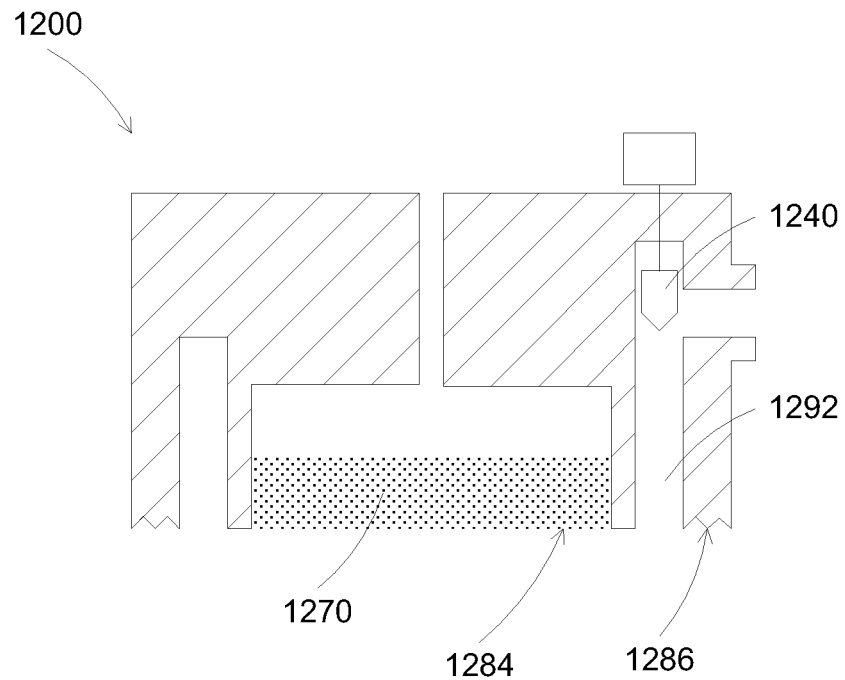
FIGS. 12A-12B illustrate exemplary protective chuck configurations according to some embodiments of the present invention.
Figure 12B:
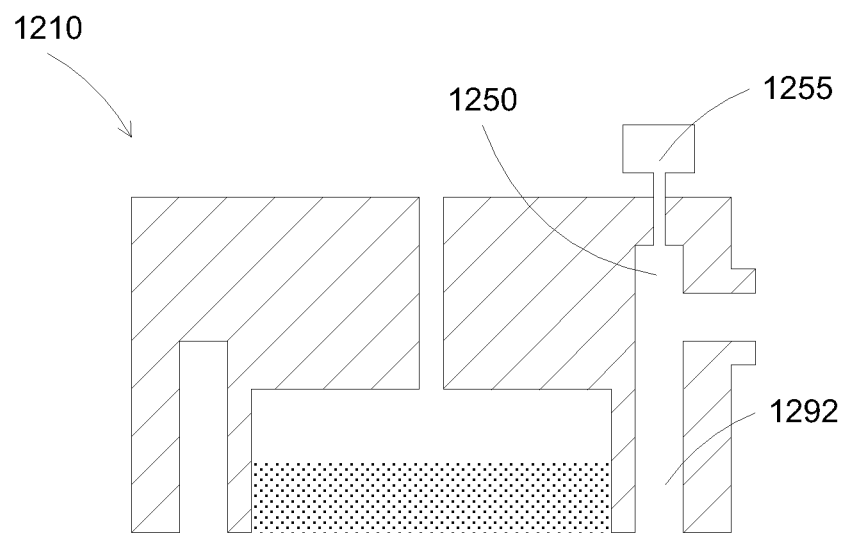

FIGS. 12A-12B illustrate exemplary protective chuck configurations according to some embodiments of the present invention. The protective chuck can comprise integrated flow restrictor, rough surface and pressure gauge coupling to enhance functionality and flexibility.

In some embodiments, the protective chuck can comprise a flow restricting mechanism at the exhaust, for example, to regulate the flow conductance, and consequently the pressure at the gas bearing layer. FIG. 12A shows a protective chuck 1200 having a valve 1240 coupled to outlet conduit 1292 to restrict an exhaust flow of the gas bearing layer. The valve 1240 can be a manual valve, which is manually adjusted to achieve a desired gas bearing layer. The valve 1240 can be an automatic valve, which can be adjusted by a controller, for example, in response to a pressure reading, to dynamically regulate a desired gas bearing layer.

In some embodiments, the surface 1286 of the outer flat area is configured to be rougher than the surface 1284 of the porous material 1270 of the protective chuck 1200. The roughness is preferably microscopic, for example, on the order of micron roughness. A flat inner surface 1284 is preferred to achieve an effective gas bearing layer. A flat, but microscopically rougher than the inner flat surface 1284, outer surface 1286 can be used to create higher resistance to the fluid flow toward the protected region under the protective chuck.

In some embodiments, a pressure gauge is provided to measure the gas pressure of the gas bearing. The pressure gauge can be coupled to the bottom surface, such as at the inner or outer recessed areas. In some embodiments, a dead area can be provided for pressure measurement, avoiding measuring directly at a gas flow path. FIG. 12B shows a protective chuck 1210 having a recessed area 1250 coupled to a pressure gauge 1255 to measure the gas pressure at the exhaust flow 1292. Other locations within the gas flow can be used.

In some embodiments, the present invention discloses methods for processing a substrate, using a protective chuck comprising a porous material configured for forming a gas bearing at a bottom surface of the protective chuck. After supplying a gas flow to the porous material of the protective chuck to create a gas flow along the bottom surface, the protective chuck is lowered onto a substrate. Under appropriate conditions, such as proper gas flow and air gap between the bottom surface of the protective chuck and the substrate surface, the gas flow can cause the protective chuck to be levitated above the substrate surface, forming a surface region on the substrate that is protected by the gas bearing layer against a fluid disposed on the substrate surface outside the surface region.

In some embodiments, the gas flow to the protective chuck exits at a first location on the bottom surface, releasing to the air ambient. The first location can be disposed at a middle area of the bottom surface, and preferably configured to be distributed to provide a uniform flow to the bottom surface area. Upon encountered and blocked by the outside fluid, the gas flow escapes through a second location on the bottom surface. The second location can be disposed at a peripheral of the bottom surface, and preferably surrounding the porous material, leaving a small bottom surface ring around the outer edge of the porous material.

In some embodiments, the protective chuck protects the surface region from the fluid without contacting the surface region. The gas pressure of the gas bearing layer can be configured to balance the fluid flow, forcing the fluid to stay outside the surface region protected by the protective chuck. The boundary between the gas layer and the outside fluid can be at the outer edge of the protective chuck, or can be somewhat inside the edge, depending on the gas pressure. At high pressure, the gas can exert a strong force against the fluid, with some gas entering the fluid, forming bubbles at the area surrounding and outside the protective chuck. At low pressure, the fluid pushes into the protected area, with some fluid mixing with the gas at the gas exhaust location, forming bubbles at the area surrounding and inside the protective chuck.

In some embodiments, the flow of the gas to the bottom surface of the protective chuck and/or the resistance or conductance of the gas flow path is controlled to achieve a desired gas pressure, and effectively a desired boundary region between the fluid outside the surface region and the gas within the surface region. A desired gas flow can be used, establishing a gas pressure that forms a fluid-gas boundary at the outer edge of the protective chuck, without any bubbles inside or outside of the protected area. In some embodiments, the gas pressure of the gas bearing layer is measured, and used to regulate the gas flow to dynamically achieve a desired gas pressure.

Figure 13A:
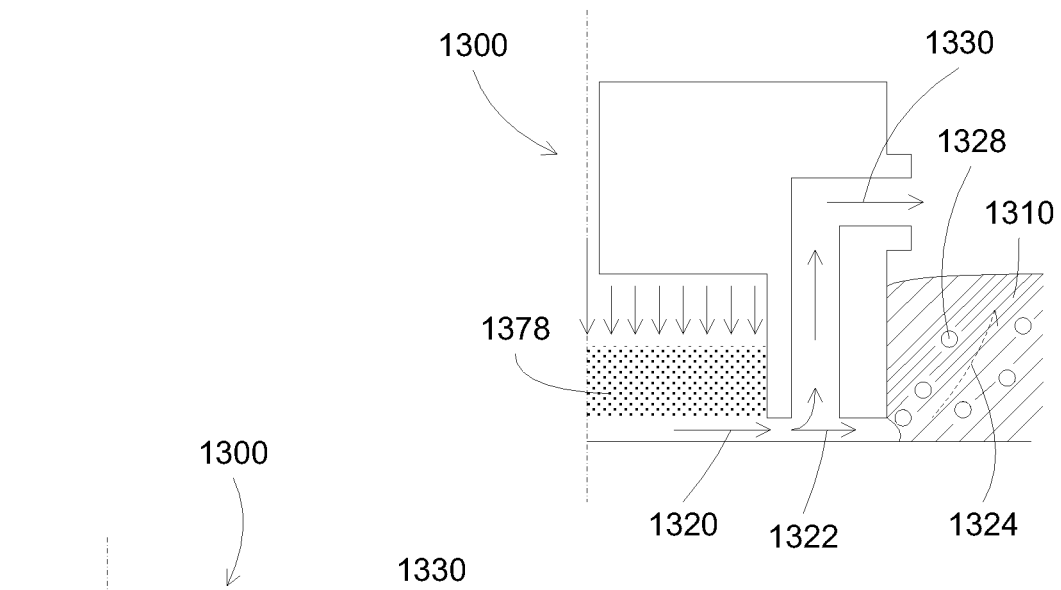
FIGS. 13A-13C illustrate different exemplary modes of operation for a gas bearing layer according to some embodiments of the present invention.
Figure 13B:
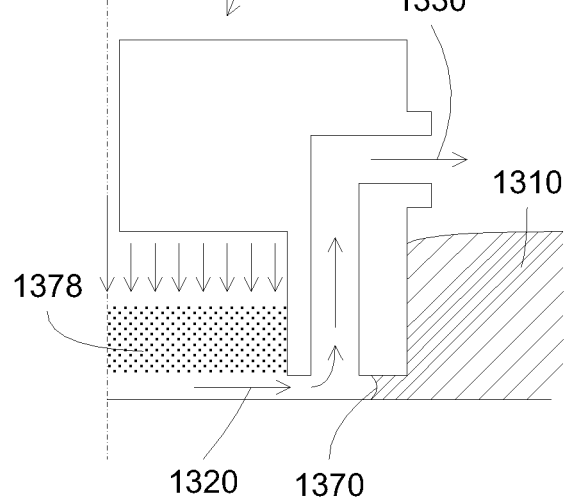
Figure 13C:
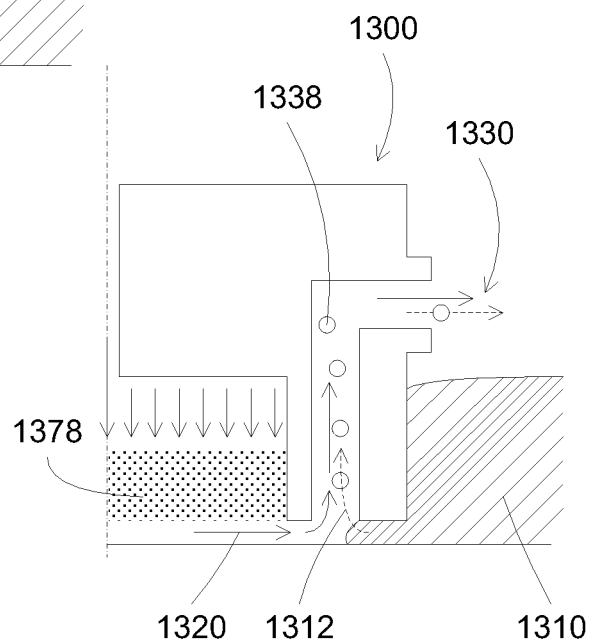

FIGS. 13A-13C illustrate different exemplary modes of operation for a gas bearing layer according to some embodiments of the present invention. In general, if the gas pressure within the gas bearing layer is too high, excess gas can escape to the surrounding fluid, creating bubbles toward the fluid surrounding the protective chuck. The high pressure can be established by a high gas flow, a low flow conductive exhaust, or a protective chuck configuration favoring high pressure gas bearing layer. Conversely, if the gas pressure is too low, outside fluid can enter the gas stream, creating aerated gas flow having fluid bubbles.

FIG. 13A shows a schematic behavior of a protective chuck with high gas bearing layer pressure, for example, created by high gas flow 1320 through the porous material 1378 at the inner flat bottom surface of the protective chuck 1300. A portion 1330 of the gas flow 1320 follows the exhaust. A portion 1322 of the flow 1320 can escape through the fluid 1310, generating a flow 1324 of gas bubbles 1328 at the area surrounding the protective chuck side surface.

FIG. 13B shows a schematic behavior of the protective chuck with balance gas bearing layer pressure. Both the fluid and gas are blocked at the gas bearing interface, forming a protected region under the protective chuck without bubble formation. The gas-fluid boundary 1370 can be varied across the outer flat area, offering a process window for the balanced gas bearing layer pressure.

FIG. 13C shows a schematic behavior of a protective chuck with low gas bearing layer pressure, for example, created by low gas flow 1320 across the inner flat bottom surface of the protective chuck 1300. With the low pressure, the fluid can enter the exhaust flow stream 1330, generating a flow 1312 of fluid bubbles 1338 within the exhaust flow 1330, creating an aerated flow 1330.

In some embodiments, different behaviors of the protective chuck can be controlled by adjusting the gas flow or the exhaust conductance. The adjustment can be performed manually or automatically. For example, the gas flow or the gas conductance can be dynamically controlled according to a pressure measurement of the gas bearing layer.

Figure 14A:
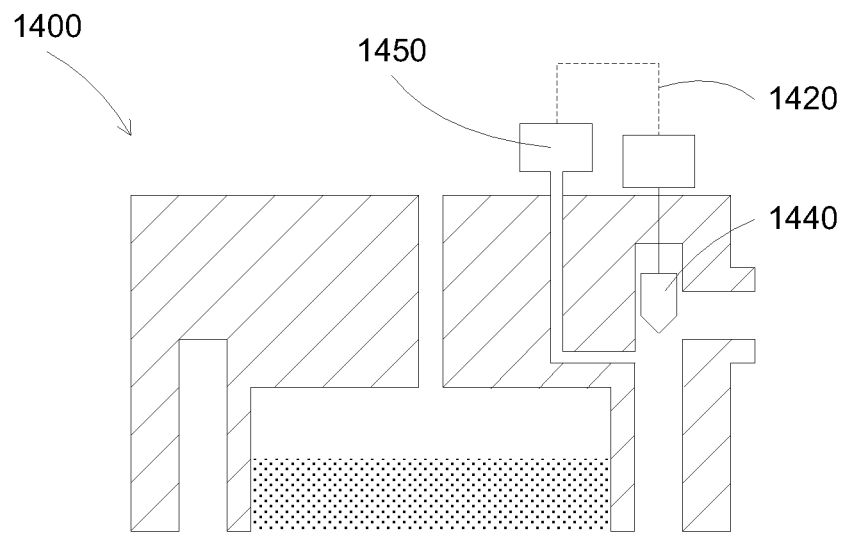
FIGS. 14A-14B illustrate exemplary dynamic controlling of a protective chuck according to some embodiments of the present invention.
Figure 14B:
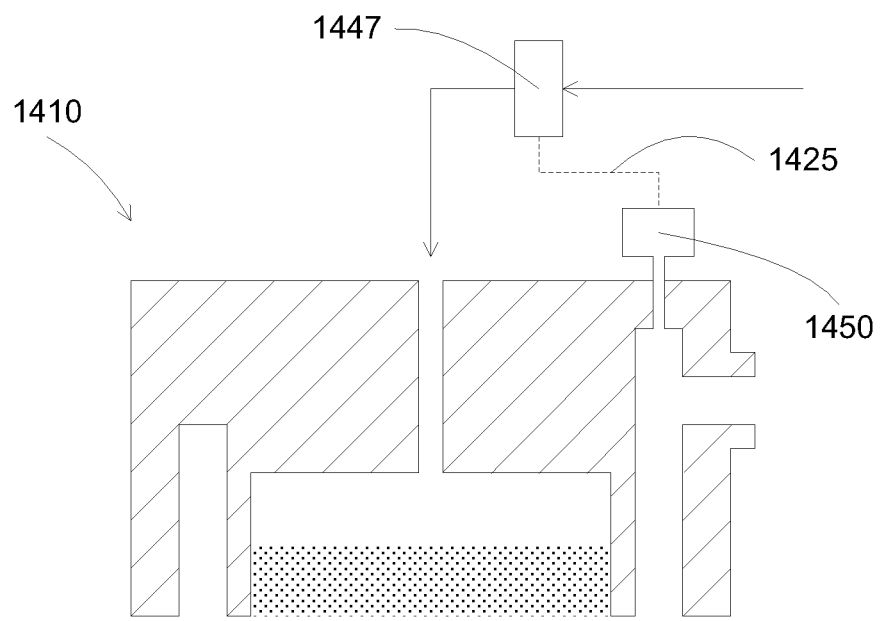

FIGS. 14A-14B illustrate exemplary dynamic controlling of a protective chuck according to some embodiments of the present invention. In FIG. 14A, a protective chuck 1400 comprising a flow conductance valve 1440 and a pressure gauge 1450 are coupled, for example, by an electrical signal path 1420. The conductance of the exhaust flow can be dynamically adjusted based on a pressure reading of the pressure gauge 1450. An optional controller can be included to control the flow valve 1440.

In FIG. 14B, a protective chuck 1410 comprising a pressure gauge 1450, which is coupled to a flow controller 1447, for example, by an electrical signal path 1425. The gas flow to the protective chuck can be dynamically adjusted based on a pressure reading of the pressure gauge 1450. An optional controller can be included to control the flow controller 1447 based on the pressure reading.

In some embodiments, the present invention discloses methods for processing a substrate, by supplying a gas flow to a protective chuck before lowering the protective chuck to the substrate surface. The gas flow forms a gas bearing layer, levitating the protective chuck. The gas pressure of the gas bearing layer prevents the fluid from entering the protected region, and at the same time, preventing the protective chuck from contacting the substrate.

In some embodiments, the present invention discloses systems and methods for processing a substrate, by using a gas bearing layer to levitating the protective chuck, in addition to pressurizing the gap between the protective chuck and the substrate surface. The gas pressure of the gas bearing layer prevents the fluid from entering the protected region.

FIGS. 15A-15B illustrate exemplary flowcharts for processing a substrate using a protective chuck according to some embodiments of the present invention. In FIG. 15A, operation 1500 flows a gas to an interior of a chuck, wherein the gas exits a bottom surface of the chuck through a porous medium. Operation 1510 lowers the chuck onto the substrate, wherein the bottom surface of the chuck is disposed in proximity to a first surface region of the substrate, wherein the gas flow at the bottom surface protects the first surface region from a fluid disposed on a second substrate surface region outside the first surface region. In some embodiments, the gas flow at the bottom surface causes the chuck to be levitated above the first surface region.

In some embodiments, the method further comprises processing the second surface region; controlling the gas flow to achieve a boundary region between the fluid and the gas flow; dynamically regulating the flow of the gas; adjusting the flow of the gas flow; regulating the flow of the gas to minimize bubbles outward to the fluid; controlling a conductance of the gas flow path to control a gas pressure between the bottom of the chuck and the first surface region; measuring a gas pressure between the bottom of the chuck and the region surface; and dynamically regulating the flow of the gas to achieve a gas pressure between the bottom of the chuck and the first surface region.

In FIG. 15B, operation 1550 establishes a gas layer between a bottom surface of a chuck and a first surface region of a substrate, wherein the gas layer is formed by a gas flow distributed at the bottom surface through a porous medium. Operation 1560 supplies a fluid on a second surface region of the substrate, wherein the second surface region is different from the first surface region, and wherein the gas layer protects the first surface region from the fluid on the second surface region. In some embodiments, the gas flow at the bottom surface causes the chuck to be levitated above the first surface region.

In some embodiments, the method further comprises processing the second surface region; adjusting a gas flow to achieve a gas pressure of the gas layer; adjusting a gas flow path conductance to achieve a gas pressure of the gas layer; measuring a gas pressure between the bottom of the protective chuck and the region surface; dynamically regulating the gas flow to achieve a gas pressure of the gas layer; cleaning the remaining surface of the substrate; wet etching the remaining surface of the substrate; submerging the substrate in a fluid tank with the surface region protected by the gas layer of the protective chuck; regulating the gas layer to not generate bubbles outward or inward of an edge of the protective chuck; regulating the gas layer to either generate gas bubbles flowing to the fluid outside the surface region or to generate fluid bubbles flowing toward the gas layer.

In some embodiments, the present invention discloses methods to process multiple isolated regions on a single substrate, comprising protecting one or more surface regions while wet processing the rest of the substrate surface without contacting the surface. For example, a gas layer can be established between a bottom surface of a protective chuck and a surface region of a substrate. A fluid is then supplied on the remaining surface of the substrate for processing the remaining surface of the substrate. The gas layer protects the surface region, establishing a gas-fluid boundary at the edge of the protective chuck, preventing the surface region under the protective chuck to be processed by the fluid. The surface region is protected by the gas bearing layer, levitating the protective chuck about the substrate surface without contacting the substrate.

In some embodiments, the present invention discloses a method for processing a substrate, comprising flowing a gas to an interior of a chuck, wherein the gas exits a bottom surface of the chuck through a porous medium; lowering the chuck onto the substrate, wherein the bottom surface of the chuck is disposed in proximity to a first surface region of the substrate, wherein the gas flow at the bottom surface protects the first surface region from a fluid disposed on a second surface region of the substrate.

In some embodiments, the gas flow at the bottom surface causes the flow cell to be levitated above the first surface region.

In some embodiments, the method further comprises controlling the gas flow to achieve a boundary region between the fluid and the gas flow; dynamically regulating the flow of the gas; processing the second surface region.

In some embodiments, the present invention discloses a method for processing a substrate, comprising establishing a gas layer between a bottom surface of a chuck and a first surface region of a substrate, wherein the gas layer is formed by a gas flow distributed at the bottom surface of the chuck through a porous medium; supplying a fluid on a second surface region of the substrate, wherein the gas layer protects the first surface region from the fluid on the second surface region.

In some embodiments, the gas layer causes the flow cell to be levitated above the first surface region.

In some embodiments, the method further comprises flowing a gas to an interior of the flow cell to form the gas flow distributed at the bottom surface of the flow cell; controlling a conductance of a gas flow path to control a gas pressure of the gas layer; measuring a gas pressure of the gas layer; dynamically regulating the gas flow to achieve a gas pressure of the gas layer; adjusting a gas flow or a gas flow path conductance to achieve a gas pressure of the gas layer; measuring a gas pressure between the bottom of the flow cell and the first surface region; dynamically regulating the gas flow to achieve a gas pressure of the gas layer; cleaning or wet etching the second surface region; submerging the substrate in a fluid tank with the first surface region protected by the gas layer.

In some embodiments, the present invention discloses a chuck for processing a substrate surface region, the chuck comprising a bottom surface comprising a porous media; a first conduit for providing a gas flow to the porous media; a second conduit surrounding a periphery of the porous media; wherein a gas flow between the first conduit and the second conduit forms a gas layer, wherein the gas layer protects a first surface region of the substrate under the chuck from a fluid disposed on a second surface region. In some embodiments, the second conduit comprises a ring inlet.

In some embodiments, the chuck further comprises a mechanism operable to levitate the flow cell above the first surface region through magnetic levitation; a pressure gauge coupled to the bottom peripheral surface to measure the gas pressure of the gas layer; a restricting valve coupled to the gas conduit.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for processing a substrate, comprising
providing a substrate, wherein the substrate comprises a first surface region and a second surface region;
providing a flow cell, wherein the flow cell comprises a hollow interior operable to receive a fluid, a peripheral portion circumscribing the hollow interior, and an inlet operable to receive gas flow, wherein the peripheral portion comprises a bottom surface and the flow cell further comprises a porous medium disposed at the bottom surface of the peripheral region such that the porous medium circumscribes the hollow interior;
flowing a gas to the inlet, wherein the gas exits the bottom surface of the peripheral portion through the porous medium; and
lowering the flow cell onto the substrate, wherein the bottom surface of the peripheral portion is disposed in proximity to the first surface region,
wherein the gas flow at the bottom surface of the peripheral portion confines a fluid disposed in the hollow interior of the flow cell from spreading from the first surface region of the substrate to the second surface region of the substrate.

2. The method as in claim 1 wherein the gas flow at the bottom surface of the peripheral portion causes the flow cell to be levitated above the first surface region.

3. The method as in claim 1 further comprising
controlling the gas flow to achieve a boundary region between the fluid and the gas flow.

4. The method as in claim 1 further comprising
dynamically regulating the flow of the gas.

5. A method for processing a substrate, comprising
providing a substrate, wherein the substrate comprises a first surface region;
providing a flow cell, wherein the flow cell comprises a hollow interior operable to receive a fluid, a peripheral portion circumscribing the hollow interior, and an inlet operable to receive gas flow, wherein the peripheral portion comprises a bottom surface and the flow cell further comprises a porous medium disposed at the bottom surface of the peripheral region such that the porous medium circumscribes the hollow interior;
positioning the flow cell on the substrate so that the bottom surface of the peripheral portion is disposed in proximity to the first surface region;
establishing a gas layer between the bottom surface and the first surface region of the substrate, wherein the gas layer is formed by a gas flow through the peripheral portion of the flow cell and distributed at the bottom surface of the flow cell through the porous medium; and
supplying a fluid to the hollow interior, wherein the gas layer confines the fluid in the hollow interior of the flow cell from spreading from the first surface region of the substrate to the second surface region of the substrate.

6. The method as in claim 5 wherein the flow cell further comprises an isolation wall extending from an upper portion of the flow cell into the hollow interior, wherein the isolation wall is spaced apart from an interior wall of the hollow interior such that bubbles formed at an interface between the gas flowing from the bottom surface of the peripheral portion and the fluid in the hollow interior are confined between the isolation wall and the interior wall of the hollow interior.

7. The method as in claim 5 wherein the gas layer causes the flow cell to be levitated above the first surface region.

8. The method as in claim 5 further comprising
flowing a gas to the flow cell to form the gas flow distributed at the bottom surface.

9. The method as in claim 5 further comprising
controlling a conductance of a gas flow path to control a gas pressure of the gas layer.

10. The method as in claim 5 further comprising
measuring a gas pressure of the gas layer.

11. The method as in claim 5 further comprising
dynamically regulating the gas flow to achieve a gas pressure of the gas layer.

12. The method as in claim 5 wherein the flow cell further comprises an isolation wall extending from an upper portion of the flow cell into the hollow interior, wherein the isolation wall is spaced apart from an interior wall of the hollow interior such that bubbles formed at an interface between the gas flowing from the bottom surface of the peripheral portion and the fluid in the hollow interior are confined between the isolation wall and the interior wall of the hollow interior, wherein the isolation wall is solid or perforated.

13. The method as in claim 5 further comprising
measuring a gas pressure between the bottom of the flow cell and the first surface region;
dynamically regulating the gas flow to achieve a gas pressure of the gas layer.

14. A method for processing a substrate, comprising
providing a substrate, wherein the substrate comprises a plurality of first surface regions and a second surface region;
providing a plurality of flow cells, wherein each flow cell comprises a hollow interior operable to receive a fluid, a peripheral portion circumscribing the hollow interior, and an inlet operable to receive gas flow, wherein the peripheral portion comprises a bottom surface and the flow cell further comprises a porous medium disposed at the bottom surface of the peripheral region such that the porous medium circumscribes the hollow interior;
flowing a gas to the inlet of each flow cell, wherein the gas exits the bottom surface of the peripheral portion of the respective flow cell through the porous medium; and
lowering the plurality of flow cells onto the substrate, wherein the bottom surface of the peripheral portion of each flow cell is disposed in proximity to a respective one of the plurality of first surface regions,
wherein the gas flow at the bottom surface of the peripheral portion of each flow cell confines a fluid disposed in the hollow interior of the flow cell from spreading from the respective first surface region of the substrate to the second surface region of the substrate.

15. The method of claim 14, further comprising combinatorially processing the plurality of first surface regions.

16. The method of claim 15, wherein each of the plurality of flow cells further comprises an isolation wall extending from an upper portion of the flow cell into the hollow interior, wherein the isolation wall is spaced apart from an interior wall of the hollow interior such that bubbles formed at an interface between the gas flowing from the bottom surface of the peripheral portion and the fluid in the hollow interior are confined between the isolation wall and the interior wall of the hollow interior.

* * * * *